United States Patent
Ghoshal et al.

[11] Patent Number: 5,863,970
[45] Date of Patent: Jan. 26, 1999

[54] EPOXY RESIN COMPOSITION WITH CYCLOALIPHATIC EPOXY-FUNCTIONAL SILOXANE

[75] Inventors: Ramkrishna Ghoshal, Clifton Park, N.Y.; Prosanto Mukerji, Phoenix, Ariz.

[73] Assignees: Polyset Company, Inc., Mechanicville, N.Y.; Motorola, Inc., Schaumburg, Ill.

[21] Appl. No.: 794,819

[22] Filed: Feb. 4, 1997

Related U.S. Application Data

[63] Continuation-in-part of Ser. No. 568,273, Dec. 6, 1995, abandoned.

[51] Int. Cl.$^6$ ............................ C08K 03/08; C08L 63/00
[52] U.S. Cl. ..................... 523/434; 523/427; 525/481; 525/484; 525/488; 525/525
[58] Field of Search ............................. 523/434; 525/525, 525/481, 484, 488

[56] References Cited

U.S. PATENT DOCUMENTS

| | | | |
|---|---|---|---|
| 4,275,190 | 6/1981 | Dudgeon | 525/122 |
| 4,297,401 | 10/1981 | Chern et al. | 428/1 |
| 4,546,018 | 10/1985 | Ryuzo et al. | 156/329 |
| 4,560,579 | 12/1985 | Siadat et al. | 156/330 |
| 4,749,120 | 6/1988 | Hatada | 156/295 |
| 4,842,800 | 6/1989 | Walles et al. | 264/272.13 |
| 4,954,580 | 9/1990 | Zahir | 525/525 |
| 4,975,221 | 12/1990 | Chen et al. | 156/330 |
| 5,073,643 | 12/1991 | Crivello | 556/64 |
| 5,086,124 | 2/1992 | Fukuyama et al. | 525/403 |
| 5,234,712 | 8/1993 | Howard | 427/215 |
| 5,260,349 | 11/1993 | Crivello | 522/31 |
| 5,384,339 | 1/1995 | Starkey | 156/330 |
| 5,508,110 | 4/1996 | Howard | 428/402 |

FOREIGN PATENT DOCUMENTS 0 389 927 A2  3/1990  European Pat. Off. .

OTHER PUBLICATIONS

Crivello, "The Synthesis and Cationic Polymerization of Novel Epoxide Monomers", Polymer Engineering and Science 32, 1462–1465 (Oct. 1992).

Ghoshal et al., "Novel Epoxy–Based Compositions for Microelectronic Packaging Applications", Annual Conference of International Society of Hybrid Microelectronics (1996).

Suryanarayana et al., "Underfill Encapsulation for Flip Chip Applications", 504–531, 1993.

*Primary Examiner*—Robert E. Sellers
*Attorney, Agent, or Firm*—Heslin & Rothenberg, P.C.

[57] ABSTRACT

A composition useful as a die-attach adhesive, polymer bump or encapsulant comprises from about 5–100% by weight of a base resin and from zero to 95% by weight of a particulate filler such as silver, wherein the base resin contains (a) from 10–95 parts by weight of a cycloaliphatic epoxy-functional siloxane, (b) from about 5–90 parts by weight of a non-silicon-containing polyepoxy resin, © from about 0.1–3 parts by weight of an iodonium salt, (d) from zero to about 3 parts by weight of a copper compound and, optionally, a silane adhesion promotor and/or an elastomeric toughener.

9 Claims, No Drawings

EPOXY RESIN COMPOSITION WITH CYCLOALIPHATIC EPOXY-FUNCTIONAL SILOXANE

CROSS-REFERENCE TO RELATED APPLICATION

This application is a continuation-in-part of our earlier, application Ser. No. 08/568,273 filed Dec. 6, 1995 abandoned.

FIELD OF THE INVENTION

The invention relates to rapidly curing epoxide compositions and processes for die-attach adhesives, polymer bumps, underfill encapsulants, and glob-top encapsulants. The compositions comprise a cycloaliphatic epoxy-functional siloxane, an epoxy resin, a diaryliodonium salt thermal initiator, or radiation sensitive initiator, fillers and, optionally, a copper compound.

BACKGROUND OF THE INVENTION

Epoxy resins are widely used in many industrial applications. They are known for their excellent chemical and thermal resistance, good electrical and mechanical properties and for their adhesion to a wide variety of substrates. However, polymers derived from epoxy resins commonly have higher coefficients of thermal expansion (CTE's) than the substrates on which they are placed. Consequently, when the formulations are used as bonding or encapsulation agents, the mismatch between the coefficients of thermal expansion of the polymer and the substrate results in stress, which may cause cracking and loss of adhesion between the epoxide and the substrates. When the substrate is an electronic device, circuit failure results. To circumvent this problem, epoxy resins are often filled with inorganic filler. Typical fillers include particulate silica, ground quartz, alumina and aluminum nitride. However, as the filler loading increases, the viscosity of the formulation increases correspondingly. This phenomenon presents severe restrictions on the potential use of resin formulations having high filler ratios since their high viscosities dramatically increase problems during applying and processing them.

If it were possible to avoid the high viscosities associated with high filler loadings, many additional applications would be immediately affected. High thermal and electrical conductivity, high hardness, high tensile strength and modulus, low shrinkage, and high density, which result from high filler loadings, would also render such materials attractive for four specific applications: die-attach adhesives, polymer bumps, underfill encapsulants, and glob-top encapsulants.

Polymer die-attach adhesives are used to bond a chip or die to a carrier or a circuit board. The die-attach adhesive provides mechanical, electrical and thermal contact between the die and the substrate. The substrate could be a leadframe, a package case, a single or multilayer ceramic, or an organic composite. Die-attach adhesives are sought to replace the expensive gold preform approach previously employed for plastic package applications. Known die-attach adhesives commonly consist of a conductive metal, usually flakes of silver or gold, together with a curable resin, commonly an epoxy or cyanate ester resin. These materials are applied as highly viscous pastes and cured in an oven.

Similarly, a polymer bump is a means of replacing conventional lead-tin solder used to attach dies to the chip carrier or lead frame. Usually, the solder is in the form of small balls placed at specific interconnects around the die. The die is inverted, placed on the substrate and heat is applied to melt the solder, thereby providing both electrical and mechanical connection to the substrate. Polymer-based replacements for solder balls are called "polymer bumps." On heating in an oven, the polymer bump must flow to wet the pads and cure, providing the desired adhesive, electrical and mechanical functions.

Underfill encapsulation is a technique used to reinforce conventional solder bumps connecting the dies to the substrate. A liquid encapsulant comprising a polymer is dispensed along the perimeter of the dies and drawn by capillary action along the surface of the solder bump connection to the substrate of the assembled package. Upon oven curing the encapsulant solidifies and reinforces the solder joints.

Glob-top encapsulation involves dispensing a liquid polymeric material atop a die or chip positioned in a packaging substrate. The polymer is subsequently solidified by thermal curing which provides a protective coating on the die. Generally, a coating between 0.15 and 3.75 mm is applied to the die, depending on the packaging application.

To succeed in these applications, a candidate material must meet the following requirements:

1. give full cure in 60 seconds or less at 200° C. or below for adhesive applications, and in 60 minutes or less at 160° C. or below for encapsulation applications;
2. possess a pot life greater than 24 hours at 25° C.;
3. have a weight loss on cure of less than 2%;
4. have a viscosity suitable for automated dispensing;
5. exhibit no filler settling on storage at 25° C. or at subzero temperatures;
6. have minimal resin bleed (i.e. bleed should be less than 0.125 mm on a variety of substrates);
7. possess low to moderate die and/or substrate warpage after cure;
8. have a low moisture absorption (less than 0.5%) at room temperature (25° C.) or at elevated temperatures ($\geq 85°$ C.); and
9. have excellent adhesion to various inorganic, organic, or metal substrates including solders, solder-masks, and fluxes.

Considerable effort has been expended by the electronics industry to produce a material that meets the above requirements for adhesive, polymer bump, and/or encapsulant applications. Epoxy resins, typically filled with 60–80% of an electrically conductive filler such as particulate silver or gold, have been proposed for die-attach adhesives. Likewise, epoxy resins, typically filled with 60–80% of an electrically nonconductive particulate filler such as silica, have been proposed for underfill and glob-top encapsulants. These epoxy-based materials appear to be suitable as adhesives or encapsulants because of their chemical resistance, electrical properties, thermal stability, and processability. However, from a polymeric materials standpoint, many of the aforementioned properties are interdependent, and one property of the system cannot be enhanced without altering another. In addition, epoxies tend to exhibit a poor shelf life, high modulus, and slow cure under normal curing conditions. Therefore, due to the aforementioned problems and disadvantages, no epoxy-based materials are currently available that meet all the above-listed requirements for die-attach adhesives, polymer bumps, underfill, and/or glob-top encapsulants.

SUMMARY OF THE INVENTION

The present invention is addressed to superior, epoxy formulations useful as die-attach adhesives (die bonding agents), polymer bumps, underfill, or glob-top encapsulants.

In one aspect the invention relates to resin compositions comprising from about 5 to 100% by weight of a base resin and from about zero to 95% by weight of a particulate filler, wherein the base resin comprises:

(a) from about 10 to 95 parts by weight of a cycloaliphatic epoxy functional siloxane selected from the group comprising

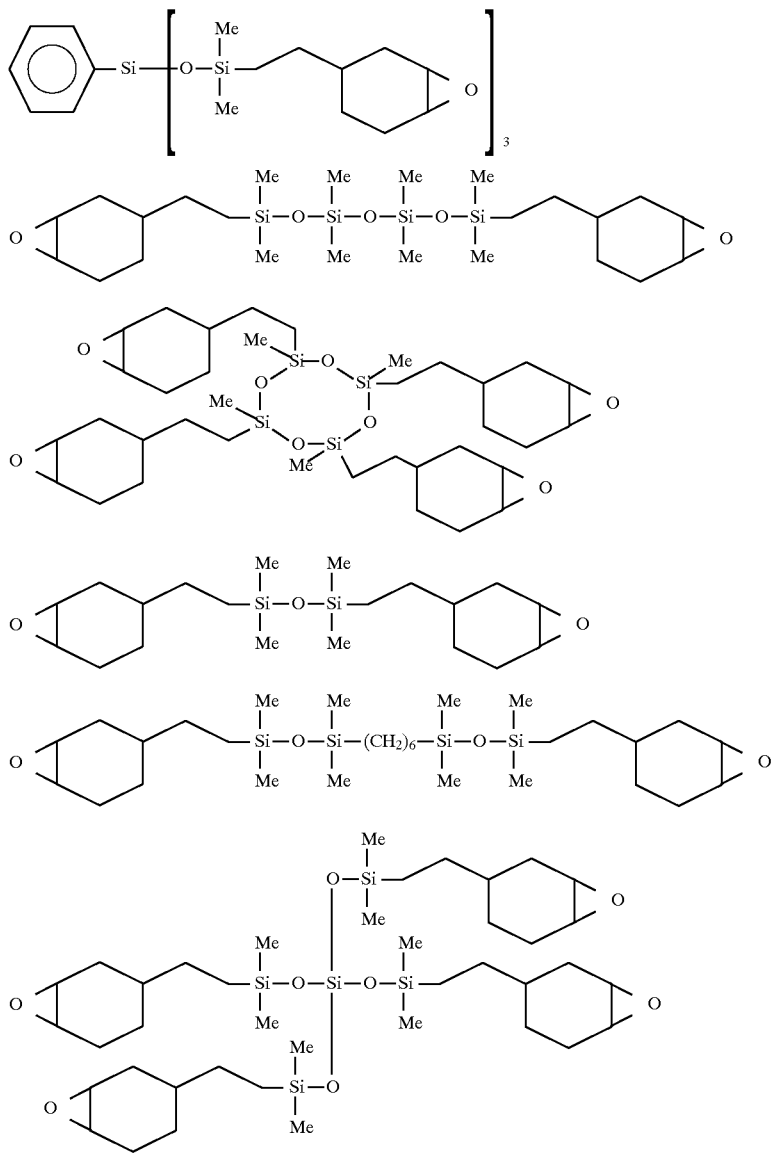

(b) from about 5 to 90 parts by weight of a non-silicon-containing di-, tri-, or polyepoxy resin or mixture of such resins;

(c) from about 0.1 to 3 parts by weight of an iodonium salt of formula

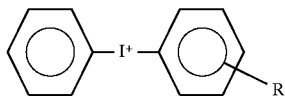

wherein M is selected from the group comprising boron, phosphorus, and antimony; X is halogen; n is 4 or 6; and R is selected from the group comprising hydrogen, $C_1$ to $C_{20}$ alkyl, $C_1$ to $C_{20}$ alkoxyl, $C_1$ to $C_{20}$ hydroxyalkoxyl, halogen, and nitro; and (d) from zero to about 3 parts by weight of a copper compound selected from the group comprising copper stearate, copper naphthenate, copper acetate, copper acetylacetonate, and copper 1,3-pentadienoate.

Preferably, the resin composition will contain from about 5 to 70% by weight of the base resin and from about 30 to 95% by weight of the particulate filler. The particulate filler may be a conductive metal, such as silver or gold, or it may be an electrically nonconductive material, such as silica, quartz, alumina, aluminum nitride, aluminum nitride coated with silica, barium sulfate, alumina trihydrate, boron nitride, carbon black, diatomaceous earth, etc. The non-silicon-containing di-, tri-, or polyepoxy resin may be a cycloaliphatic resin, particularly 3,4-epoxycyclohexylmethyl 3', 4'-epoxycyclohexane carboxylate, dicyclopentadiene dioxide, or bis(3,4-epoxycyclohexyl adipate; a resin of diglycidyl ether of bisphenol A; a resin of diglycidyl ether of bisphenol F; a resin of diglycidyl ether of brominated bisphenol A; an epoxidized vegetable oil; an epoxy cresol novolac; an epoxy phenol novolac; or an α-olefin epoxide. A preferred iodonium salt is [4-(2-hydroxy-1-tetradecyloxy)-phenyl] phenyliodonium hexafluoroantimonate.

The composition may additionally comprise (a) from about 3 to 30 parts by weight of a toughener selected from the group comprising epoxidized polybutadiene, carboxyl-terminated polybutadiene, carboxyl-terminated polybutadiene acrylonitrile, and particulate elastomer fillers; (b) from about 0.5 to 8 parts by weight of an adhesion promoting agent selected from the group comprising glycidoxypropyltrimethoxysilane, octyltriethoxysilane, mercaptopropyltriethoxysilane, and mixtures thereof; or a combination of any of (a) and (b).

A particularly preferred resin composition, especially useful as a die-attach adhesive, comprises from about 5 to 40% by weight of the base resin and from about 60 to 95% by weight of the particulate filler selected from the group comprising silver, gold, silica, alumina, quartz, aluminum nitride, aluminum nitride coated with silica, barium sulfate, alumina trihydrate, and boron nitride. In this embodiment, the base resin comprises: (a) from about 20 to 45 parts by weight of 1,1,3,3-tetramethyl-1,3-bis[2-(7-oxabicyclo[4.1.0]hept-3-yl) ethyl]disiloxane; (b) from about 40 to 60 parts by weight of 3,4-epoxycyclohexylmethyl 3', 4'-epoxycyclohexane carboxylate; (c) from about 0.5 to 3 parts by weight of [4-(2-hydroxy-1-tetradecyloxy)-phenyl] phenyliodonium hexafluoroantimonate; (d) from zero to about 2 parts by weight of copper stearate or copper naphthenate; (e) from about 0.4 to 3.5 parts by weight of glycidoxypropyltrimethoxysilane, octyltriethoxysilane, mercaptopropyltriethoxysilane, or mixtures thereof; and (f) from about 5 to 20 parts by weight of epoxidized polybutadiene, carboxyl-terminated polybutadiene, or carboxyl-terminated polybutadiene acrylonitrile.

Another particularly preferred resin composition, especially useful as a polymer bump or solder bump replacement, comprises from about 5 to 40% by weight of the base resin and from about 60 to 95% by weight of an electrically conductive particulate filler such as silver or gold. In this embodiment, the base resin comprises: (a) from about 20 to 50 parts by weight of 1,1,3,3-tetramethyl-1,3-bis[2-(7-oxabicyclo[4.1.0]hept-3-yl)ethyl]disiloxane; (b) from about 30 to 60 parts by weight of 3,4-epoxycyclohexylmethyl 3',4'-epoxycyclohexane carboxylate; (c) from about 0.5 to 3 parts by weight of [4-(2-hydroxy-1-tetradecyloxy)-phenyl]phenyliodonium hexafluoroantimonate; (d) from zero to about 0.3 parts by weight of copper stearate or copper naphthenate; (e) from about 1 to 5 parts by weight of glycidoxypropyltrimethoxysilane, octyltriethoxysilane, mercaptopropyltriethoxysilane, or mixtures thereof; and (f) from about 5 to 10 parts by weight of epoxidized polybutadiene, carboxyl-terminated polybutadiene, or carboxyl-terminated polybutadiene acrylonitrile.

Another particularly preferred resin composition, especially useful as an underfill encapsulant, comprises from about 30 to 50% by weight of the base resin and from about 50 to 80% by weight of an electrically nonconductive particulate filler selected from the group of silica, quartz, alumina, aluminum nitride, aluminum nitride coated with silica, barium sulfate, alumina trihydrate, and boron nitride. In this composition, the base resin comprises: (a) from about 30 to 70 parts by weight of 1,1,3,3-tetramethyl-1,3-bis[2-(7-oxabicyclo[4.1.0]hept-3-yl)ethyl]disiloxane; (b) from about 20 to 65 parts by weight of 3,4-epoxycyclohexylmethyl 3',4'-epoxycyclohexane carboxylate; (c) from about 0.5 to 3 parts by weight of [4-(2-hydroxy-1-tetradecyloxy)-phenyl]phenyliodonium hexafluoroantimonate; (d) from zero to about 1.5 parts by weight of copper stearate or copper naphthenate; (e) from about 1 to 8 parts by weight of glycidoxypropyltrimethoxysilane, octyltriethoxysilane, mercaptopropyltriethoxysilane, or mixtures thereof; and (f) from about 3 to 10 parts by weight of epoxidized polybutadiene, carboxyl-terminated polybutadiene, or carboxyl-terminated polybutadiene acrylonitrile.

Another particularly preferred resin composition, especially useful as a glob-top encapsulant, comprises from about 15 to 40% by weight of the base resin and from about 60 to 85% by weight of an electrically nonconductive particulate filler selected from the group comprising silica, quartz, alumina, aluminum nitride, aluminum nitride coated with silica, barium sulfate, alumina trihydrate, and boron nitride. The base resin comprises: (a) from about 20 to 50 parts by weight of 1,1,3,3-tetramethyl-1,3-bis[2-(7-oxabicyclo[4.1.0]hept-3-yl) ethyl]disiloxane; (b) from about 30 to 70 parts by weight of 3,4-epoxycyclohexylmethyl 3', 4'-epoxycyclohexane carboxylate and from zero to about 30 parts by weight of a diglycidyl ether of bisphenol A, a diglycidyl ether of bisphenol F, a diglycidyl ether of tetrabromo-bisphenol A, an epoxy cresol novolac, or an epoxy phenol novolac; (c) from about 0.5 to 3 parts by weight of [4-(2-hydroxy-1-tetradecyloxy)-phenyl] phenyliodonium hexafluoroantimonate; (d) from zero to about 1 part by weight of copper stearate or copper naphthenate; (e) from about 1 to 5 parts by weight of glycidoxypropyltrimethoxysilane, octyltriethoxysilane, mercaptopropyltriethoxysilane, or mixtures thereof; and (f) from about 4 to 10 parts by weight of epoxidized polybutadiene, carboxyl-terminated polybutadiene, or carboxyl-terminated polybutadiene acrylonitrile.

In another aspect, the invention relates to a method for attaching a die to a substrate comprising: (a) depositing on a substrate a die-attach adhesive comprising a resin composition as described above; (b) positioning a die on the substrate in contact with the die-attach adhesive composition; and (c) heating the substrate, die and die-attach adhesive at 110° to 200° C. for 0.5 to 240 minutes. The person of skill will, of course, appreciate that depositing the composition on the die would be equivalent to depositing it on the substrate for the purpose of the invention. Preferably, the heating step is performed at 130° to 150° C. for 30 to 90 minutes; at 150° to 160° C. for 5 minutes to 1 hour; or at 160° to 180° C. for 30 seconds to 5 minutes.

In yet another aspect, the invention is a method for reinforcing a solder bump connection or a polymer bump connection from a die to a substrate comprising: (a) depositing an underfill encapsulant comprising a resin composition as described above on the periphery of a die, wherein the die is both physically and electrically connected to a substrate by a solder bump connection or a polymer bump connection; (b) allowing the deposited underfill encapsulant composition to contact the substrate while simultaneously contacting the die through capillary action along the surface of the solder or polymer bump connection; and (c) heating the substrate, die and underfill encapsulant at 100° to 170° C. for 5 to 240 minutes, preferably at 120° to 160° C. for 15 to 180 minutes. The underfill encapsulant is deposited to a thickness between about 0.025 and 1 mm, but a thickness between about 0.025 and 0.1 mm is preferred.

In yet another aspect, the invention is a method for protecting a die attached to a substrate comprising: (a) depositing a glob-top encapsulant comprising a resin composition as described above atop a die attached to a substrate; and (b) heating the die and glob-top encapsulant at 100° to 170° C. for 5 to 240 minutes, preferably at 120° to 160° C. for 15 to 180 minutes. Typically the composition is dispensed onto the die to a thickness between about 0.10 and 1.25 mm thick depending on the packaging application.

Even at a filler loading up to 95% for higher thermal and electrical conductivity, the viscosities of the compositions are still low enough for dispensing and other application conditions. The compositions also possess high thermal and electrical conductivity, high hardness, low water absorption, and low shrinkage. In addition, these compositions can be cured rapidly at low temperatures and yet provide an extended shelf life at room temperature. The above-mentioned combination of properties of the polymer together with low viscosity and rapid curing times of the prepolymer mix have not previously been achieved with single component epoxy resin formulations.

DETAILED DESCRIPTION OF THE INVENTION

Shown below are the structures of several cycloaliphatic epoxy functional siloxane resins that may be included in the base resin component of the resin composition of the present invention:

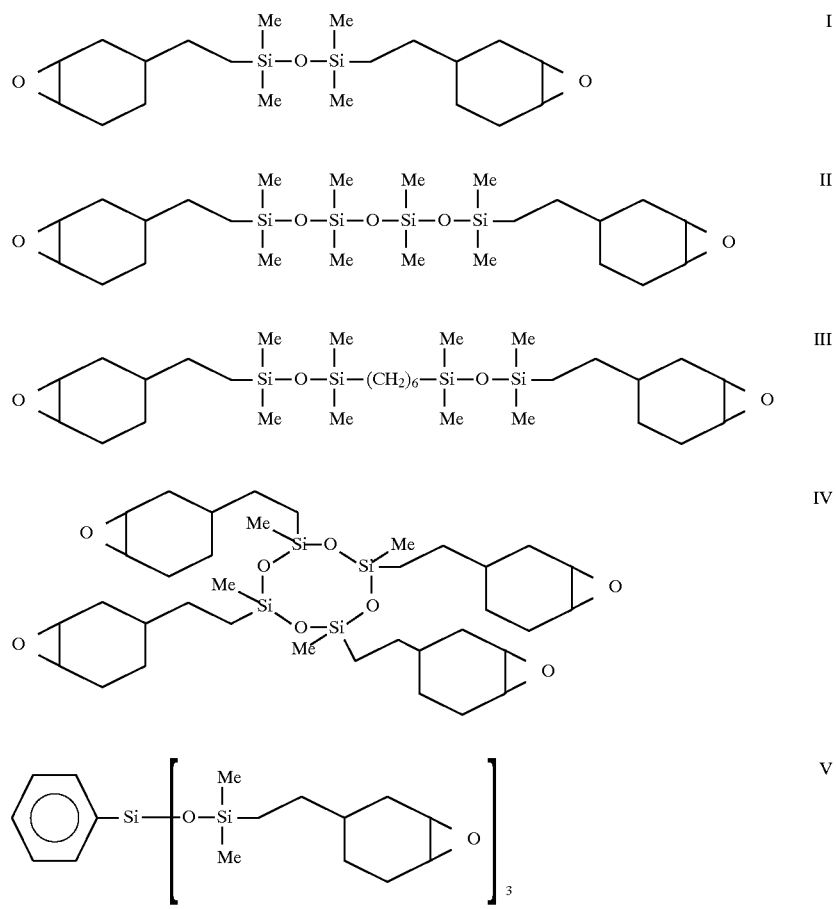

-continued

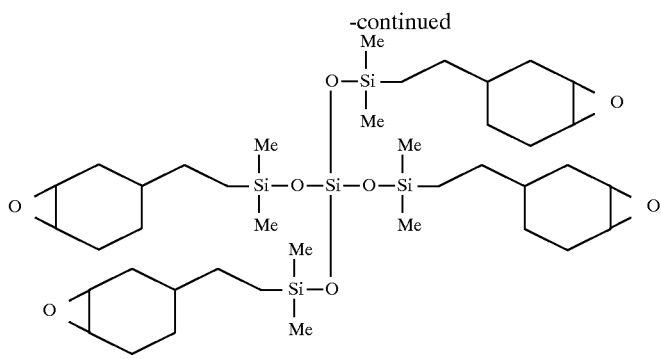

Structure I in the above list, 1,1,3,3-tetramethyl-1,3-bis[2-(7-oxabicyclo[4.1.0]hept-3-yl)ethyl]disiloxane, is referred to in this disclosure as "siloxy monomer I." Cycloaliphatic epoxy functional siloxane resins can be incorporated into the final formulation in amounts ranging from about 10 to 95% of the total epoxy base resin. The term "cycloaliphatic epoxy" as used herein refers to epoxy resins in which the reactive epoxide functionality is attached to a 5, 6 or 7-membered ring so as to form an oxabicyclo[n.1,0]alkane, where n is 5, 6 or 7.

A wide variety of other non-silicon containing epoxy resins may be used in combination with the above cycloaliphatic epoxy functional siloxane resins in the base resin. These include cycloaliphatic epoxy resins such as 3,4-epoxycyclohexyl 3',4'-epoxycyclohexane carboxylate (EECH), bis(3,4-epoxycyclohexyl) adipate, 4-vinylcyclohexene dioxide, limonene dioxide and dicyclopentadiene dioxide; α-olefin epoxides such as 1,2-epoxytetradecane, 1,2-epoxydecane, 1,2-epoxydodecane; glycidyl ethers including bisphenol-A diglycidyl ether, bisphenol-F diglycidyl ether, and their extended chain analogs, 1,4-butanediol diglycidyl ether; brominated epoxy resins such as diglycidyl ethers of tetrabromo-bisphenol-A; epoxy cresol novolacs; epoxy phenol novolacs; epoxidized vegetable oils such as epoxidized soybean oil and epoxidized linseed oil; and glycidyl ester resins, as for example, diglycidyl phthalate to mention a few. 3,4-Epoxycyclohexylmethyl 3', 4'-epoxycyclohexane carboxylate, also known as 7-oxabicyclo[4.1.0]hept-3-ylmethyl 7-oxabicyclo[4.1.0]heptane-3-carboxylate)

EECH

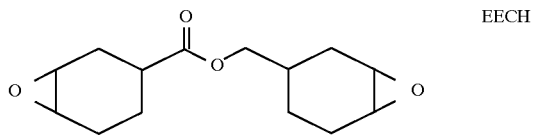

which is available from Union Carbide as ERL 4221E, bis(3,4-epoxycyclohexyl) adipate

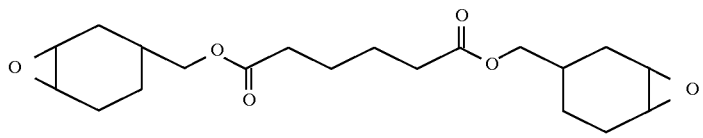

which is available from Union Carbide as ERL 4299, and dicyclopentadiene dioxide are the preferred cycloaliphatic epoxy resins. The above listed non-silicon containing epoxy resins may be included alone with the cycloaliphatic epoxy functional siloxane to form a binary epoxy mixture or further combined with others to make more complex epoxy mixtures.

The epoxy formulations of the invention undergo rapid and efficient cure at low temperatures through the addition of a diaryliodonium salt catalyst to the base resin. The general structure of a diaryliodonium salt is represented as

VI

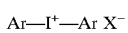

in which Ar represents an aryl group and $X^-$ is a complex anion of the type $BF_4^-$, $PF_6^-$, $PF_6^-$, $CF_3SO_3^-$, and $(C_6F_5)_4B^-$. Some examples of diaryliodonium salts which may be employed in this invention include the following:

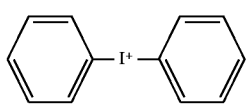

$SbF_6^-$

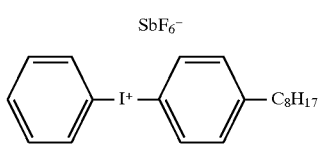

$SbF_6^-$

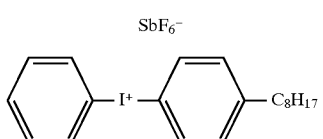

$PF_6^-$

-continued

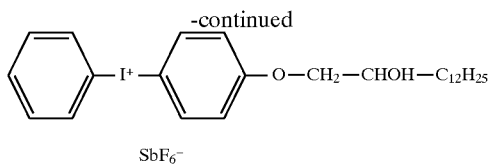

Of the diaryliodonium salt examples shown above, [4-(2-hydroxy-1-tetradecyloxy)-phenyl]phenyliodonium hexafluoroantimonate, is preferred. Typically, the base resin comprises from about 0.1 to 3 parts by weight by weight of the diaryliodonium salt.

A copper compound may optionally be employed as a co-catalyst in the base resin to provide for thermal curing of the epoxy resin at lower temperatures. For example, as shown in the following Example 3, the addition of a copper compound to the base resin of Example 2 halves the gel time at 140° C. However, the presence of the copper compound often decreases the shelf life of the epoxy formulations. Thus, the artisan will normally decide whether to include the copper compound depending on the relative importance of shelf life and cure time for the particular application. Copper compounds which may be used as co-catalysts in the course of this invention include almost any copper compound known; however, those which exhibit reasonable solubility in the epoxy resin are preferred: copper stearate, copper naphthenate, copper acetate, copper acetylacetonate, copper 1,3-pentadienoate, etc. The base resin may include up to about 3 parts by weight of the copper compound. However, typically, only about 7 to 15% by weight of the amount of the iodonium salt catalyst included in the base resin is required to cure the epoxide resin.

A wide range of thermal and electrical conducting and nonconducting fillers may be employed together with the epoxy resins cited above in the base resin for the formulation of a die-attach adhesive, polymer bump, underfill encapsulant, or glob-top encapsulant. These include, but are not limited to, particulate silica, ground α-quartz, alumina, aluminum nitride (preferably coated with silica), barium sulfate, alumina trihydrate, boron nitride, flaked or particulate silver, flaked or particulate gold, glass microballoons, silver plated microballoons, silver plated glass beads, carbon black, and diatomaceous earth. A preferred electrical conducting filler is silver of particle size between 1 and 35 $\mu$m. Preferred electrical nonconducting fillers, particularly useful in underfill and glob-top applications, include silica and aluminum nitride (preferably coated with silica) having particle sizes between 0.5 to 120 $\mu$m. The filler content can range from 10 to 95% by weight of the final formulation depending on the application. Typically, die-attach adhesives will contain from about 60 to 95% by weight particulate filler; polymer bumps, from about 60 to 95% by weight of an electrical conducting filler; underfill encapsulants, from about 50 to 80% by weight of an electrical nonconducting filler; and glob-top encapsulants, from about 60 to 85% by weight of an electrical nonconducting filler.

Aluminum nitride and silica fillers may be treated with silane using commonly known methods, or obtained commercially, then added to the composition as electrically nonconductive fillers. Examples of commercially available silane-treated fillers include spherical silica treated with octyltriethoxysilane or glycidoxypropyltrimethoxysilane from Tatsumori as PLV-6S or PLV-10S. Note that no particular advantage is observed with the use of treated as opposed to untreated silica or with the use of spherical as opposed to particulate silica. Therefore, any of the aforementioned silica variations may be employed.

Aluminum nitride, also useful as an electrically nonconductive, but thermally conductive, filler in the formulation, is preferably coated with silica because of the superior hydrolytic stability the coated material has over uncoated aluminum nitride, i.e. hydrolysis of the nitride to ammonia is avoided upon contact with water if a coating of silica is deposed on the nitride. In addition, the inclusion of silica-coated aluminum nitride to the formulation is advantageous because a higher thermal conductivity can be obtained with the coated aluminum nitride than with crystalline silica alone. A suitable silica-coated aluminum nitride for use in the formulation and its respective method of preparation are disclosed in U.S. Pat. Nos. 5,508,110 and 5,234,712. Commercially, the material is available from Dow Chemical Company as Dow Filler Grade AlN.

The resin formulations of the present invention may be modified by the incorporation of hydroxy or other functional oligomers to provide flexible resins. To this end, hydroxyl terminal polyesters, epoxidized polybutadiene, polyether polyols, and the condensation products of carboxylated butadiene or carboxylated butadiene acrylonitrile with epoxides can be employed. Formulations can be further modified by adding particulate rubber fillers or polymeric rubber modifiers to improve the toughness of the compositions. An example is Paraloid 2691, which is a particulate elastomeric. Paraloid 2691 is commercially available in powdered form from Rohm and Haas. Another example of a particulate elasteromeric modifier is Dow Corning's D.C. 4-7051, which is a silicone elastomer available in powdered form. Other modifiers, such as wetting, flow control, coupling and flatting agents, as well as fire retardants, pigments and dyes such as carbon black and phthalo blue, may also be incorporated in the formulations of this disclosure.

Although the basic compositions exhibit the desired features for die-attaches, polymer bumps, underfill encapsulants, and glob-top encapsulants, it has been found that they can be optimized for use in specific IC fabrication processes by the inclusion of certain additives. To improve the survival of the polymeric die-attach or encapsulant on further processing at high temperatures, it is advantageous to add from about 3 to about 30 parts by weight of a toughener to the base resin. Epoxidized polybutadiene of molecular weight 1500–3000 having an oxygen content of about 6% (available from Sartomer as [PolyBD]™ and from ELF Atochem) and carboxyl-terminated polybutadiene or carboxyl-terminated polybutadiene acrylonitrile of molecular weight 3000–5000 (available as HYCAR™ CTB-2000-162 and CTBN 1300×31, respectively, from B.F. Goodrich) have been found suitable for this purpose. Antioxidants may be added to improve storage life. Blocked phenols, such as Ciba-Geigy's IRGANOX™ have been found suitable for this purpose. Surfactants, such as Pluronic L-101 which is commercially available from BASF, may also be added to improve flow and wetting characteristics. Concentrations from about 0.1 to 2.0 parts by weight based on the base resin have been found suitable for this purpose.

The resin compositions of the present invention can be cured by application of thermal energy; the cure may be conducted in an oven, on a hot plate, under infrared radiation or under microwave irradiation. Heating may be varied according to time and temperature so as to provide the optimal combination of time and temperature for the specific application.

The resin compositions of the present invention may be deposited onto a substrate to attach a die to a substrate (die-attach adhesive), onto the periphery of a die connected to a substrate by a solder bump or polymer bump to reinforce the solder or polymer bump connection (underfill encapsulant), or onto a die attached to a substrate to protect the die (glob-top encapsulant). The compositions may be deposited by screen printing, stencil printing, syringe dispensing or any of the other techniques well known in the art. Typical die-attach adhesives based on the above formulations are cured at temperatures from about 110° to 200° C. Cure times can range from 30 seconds to 2 hours. Typical underfill or glob-top encapsulants are cured at temperatures from 100° to 170° C. for 5 minutes to 2 hours, but preferably from 120° to 160° C. for 15 to 180 minutes.

Thus, for example, for use as a die-attach adhesive, the resin composition preferably comprises from about 5 to 40% by weight base resin and from about 60 to 95% by weight particulate filler, thermally conducting and either electrically conducting or nonconducting. The base resin preferably comprises (a) from about 20 to 45 parts by weight of 1,1,3,3-tetramethyl-1,3-bis[2-(7-oxabicyclo[4.1.0]hept-3-yl)ethyl]disiloxane; (b) from about 40 to 60 parts by weight of 3,4-epoxycyclohexylmethyl 3',4'-epoxycyclohexane carboxylate; (c) from about 0.5 to 3 parts by weight of [4-(2-hydroxy-1-tetradecyloxy)phenyl]phenyl iodonium hexafluoroantimonate; (d) from zero to about 2 parts by weight of copper stearate or copper naphthenate; (e) from about 0.4 to 3.5 parts by weight of glycidoxypropyltrimethoxysilane, octyltriethoxysilane, mercaptopropyltriethoxysilane, or combinations thereof; (f) from about 3 to 15 parts by weight of epoxidized polybutadiene, carboxyl-terminated polybutadiene, or carboxyl-terminated polybutadiene acrylonitrile. The above die-attach adhesive is initially deposited on a substrate, and a die is positioned on the substrate in contact with the adhesive. Curing may be accomplished at 110° to 200° C. for 0.5 to 240 minutes. Alternatively, the die-attach adhesive can be cured at 130° to 150° C. for 30 to 90 minutes, at 150° to 160° C. for 5 minutes to 1 hour, or at 160° to 180° C. for 30 seconds to 5 minutes. Likewise, based on the description provided above, one skilled in the art can optimize the resin composition of the present invention and optimize the heating times and temperatures of the method of the present invention for applications related to underfill and glob-top encapsulation.

The following examples are given by way of illustration and are not intended to be limitative.

EXAMPLE 1
DIE ATTACH ADHESIVE

A base formulation consisting of the following components was prepared:

| Component | Parts by Weight |
|---|---|
| EECH cycloaliphatic epoxy resin (ERL 4221E) | 50 |
| Siloxy monomer I | 37 |
| Epoxidized polybutadiene (PolyBD 565) | 10 |
| 4 (2-hydroxy-1-tetradecyloxyphenyl) phenyliodonium hexafluoroantimonate | 1.0 |
| Copper stearate (10% dispersion in Epon 828) | 1.1 |
| Antioxidant (Irganox 1035) | 0.3 |
| Adhesion promoter - glycidyloxy-propyltrimethoxysilane (A187) | 0.7 |
| Wetting agent (Pluronic L-101) | 0.1 |

Using the above base resin, three formulations with particulate silver were prepared containing the following two particulate silver materials (Silflake 95–235, 3–5 μm and Silflake 95–131, 5–9 μm).

| Formulation 1-1 | |
|---|---|
| Base resin | 19 |
| Silflake 95–235 | 40.5 |
| Silflake 95–131 | 40.5 |
| Formulation 1-2 | |
| Base resin | 19 |
| Silflake 95–235 | 81 |
| Formulation 1-3 | |
| Base resin | 17 |
| Silver flake 95–235 | 83 |

The following table gives the viscosity, glass transition temperature and the gel times at 140° and 175° C.

| Property | Formulation 1 | Formulation 2 | Formulation 3 |
|---|---|---|---|
| Visc., cps at 25° C. (Cp-52, 2.5 rpm) | 15000 | 21000 | 28000 |
| $T_g$, °C. | >150 | >150 | >150 |
| Gel Time (min) | | | |
| 140° C. | 2 | 2 | 2 |
| 175° C. | <1 | <1 | <1 |

Formulation 1-1 was further tested and the following properties were observed following a cure cycle of 1 hour at 140° C.

| | | |
|---|---|---|
| Specific Gravity | | 3.74 |
| Coefficient of thermal expansion | | 45–55 ppm |
| Storage Modulus | @ 25° C. | 8 ± 1 GPA |
| | @ 150° C. | 0.9 ± 0.1 GPA |
| Shear Strength, psi | | >2000 |
| Die-Shear, Kg (1.25 mm × 1.25 mm, bare copper) Cure 1 min @ 170° C. | | >3.00 |
| Ionic Content (Na,K,Cl) | | <10 ppm |
| Maximum Weight loss during cure | | |
| @ 140° C. | | <0.05% |
| @ 160° C. | | <0.1% |
| Resin Bleed | | 0 to 0.075 mm |
| Die Warpage | | low to no die warpage |
| Silver settling | | none |
| Shelf life | | |
| @ 25° C. | | >14 da |
| @ −10° C. | | >3 mo |
| @ −40° C. | | >6 mo |
| Weight loss (Thermal Stability) | | |
| @ 300° C. | | <0.15% |
| @ 350° C. | | <0.3% |
| @ 425° C. | | <1.0% |
| Moisture Absorption | | |
| 7 days at 25° C. | | 0.05% |
| 85° C. / 85% R.H. | | 0.15% |

EXAMPLE 2

DIE ATTACH ADHESIVE

In a similar manner to Example 1, a base resin was prepared consisting of the following components:

| Component | Parts by Weight |
| --- | --- |
| ERL 4221E (EECH) | 46 |
| Siloxy monomer I | 36 |
| Siloxy monomer/carboxyl terminated polybutadiene adduct (50:50) | 15 |
| Irganox 1035 | 0.3 |
| 4 (2-hydroxy-1-tetradecyloxyphenyl) phenyl-iodonium hexafluoroantimonate (50% in 4221E) | 2.0 |
| A187 glycidyloxypropyltrimethoxysilane | 0.7 |
| Pluronic L-101 surfactant | 0.1 |

Using the above base resin, a formulation 2-1 with particulate silver was prepared containing the following components:

| | |
| --- | --- |
| Base resin | 19 |
| Silflake 95–235 | 40.5 |
| Silflake 95–131 | 40.5 |

The above formulation had a viscosity of 15000 centipoise at 25° C. The gel time obtained on curing at 140° C. was 4 minutes. At 175° C. the gel time was less than 1 minute and the polymer so obtained had a $T_g$ of >150° C.

EXAMPLE 3
DIE ATTACH ADHESIVE

In a similar manner to Example 2, a base resin was prepared consisting of the following components:

| Component | Parts by Weight |
| --- | --- |
| ERL 4221E (EECH) | 46 |
| Siloxy monomer I | 35 |
| Siloxy monomer/carboxyl terminated polybutadiene adduct (50:50) | 15 |
| Irganox 1035 | 0.3 |
| 4 (2-hydroxy-1-tetradecyloxyphenyl) phenyl-iodonium hexafluoroantimonate (50% in 4221E) | 2.0 |
| A187 glycidyloxypropyltrimethoxysilane | 0.7 |
| Pluronic L-101 surfactant | 0.1 |
| Copper stearate (10% dispersion in Epon 828) | 1.1 |

Using the above base resin, a formulation 3-1 with particulate silver was prepared containing the following components:

| | |
| --- | --- |
| Base resin | 19 |
| Silflake 95–235 | 40.5 |
| Silflake 95–131 | 40.5 |

The above formulation had a viscosity of 16000 centipoise at 25° C. The gel time obtained on curing at 140° C. was 2 minutes and at 175° C. the gel time was <1 minute and the polymer so obtained had a $T_g$ of >150° C. From this experiment, the effect of the presence of the copper stearate co-catalyst on shortening the cure time at 140° C. can be seen.

EXAMPLE 4
DIE ATTACH ADHESIVE

Repeating the above procedure, a base resin was prepared consisting of the following components:

| Component | Parts by Weight |
| --- | --- |
| ERL 4221E (EECH) | 54 |
| Siloxy monomer I | 28 |
| Epoxidized polybutadiene | 15 |
| 4 (2-hydroxy-1-tetradecyloxyphenyl) phenyl-iodonium hexafluoroantimonate | 1.0 |
| A187 glycidyloxypropyltrimethoxysilane | 1.0 |
| Copper stearate (10%) dispersion in Epon 828) | 1.0 |

Using the above base resin, a formulation 4-1 with particulate silver was prepared containing the following components:

| | |
| --- | --- |
| Base resin | 21 |
| Silflake 95–235 | 39.5 |
| Silflake 95–131 | 39.5 |

The above formulation had a viscosity of 30000 centipoise at 25° C. After curing for 1 hour at 140° C., the polymer so obtained had a $T_g$ of >140° C.

EXAMPLE 5
DIE ATTACH ADHESIVE

The above example was repeated with the following modifications. A base resin was prepared consisting of the following components.

| Component | Parts by Weight |
| --- | --- |
| ERL 4221E (EECH) | 49 |
| Siloxy monomer I | 25 |
| Epoxidized PolyBD | 15 |
| α-olefin oxide | 8.0 |
| Irganox 1035 | 0.3 |
| 4 (2-hydroxy-1-tetradecyloxyphenyl) phenyl-iodonium hexafluoroantimonate | 1.0 |
| A187 glycidyloxypropyltrimethoxysilate | 0.7 |
| L-101 nonionic surfactant | 0.1 |
| Copper stearate (10% dispersion in Epon 828) | 1.0 |

Using the above base resin, a formulation 5-1 with particulate silver was prepared containing the following components:

| | |
| --- | --- |
| Base resin | 21 |
| Silflake 95–235 | 39.5 |
| Silflake 95–131 | 39.5 |

The above formulation had a viscosity of 13000 centipoise at 25° C. After curing for 1 hour at 140° C. the $T_g$ of the polymer so obtained was 120° C.

EXAMPLE 6
DIE ATTACH ADHESIVE

The above experiment was repeated with modifications. A base resin was prepared consisting of the following components:

| Component | Parts by Weight |
|---|---|
| ERL 4221E (EECH) | 50 |
| Siloxy monomer I | 27 |
| Siloxy monomer/carboxyl terminated polybutadiene adduct (50:50) | 12 |
| α-olefin oxide | 8 |
| 4 (2-hydroxy-1-tetradecyloxyphenyl) phenyl-iodonium hexafluoroantimonate | 1.0 |
| A187 glycidyloxypropyltrimethoxysilane | 0.7 |
| Pluronic L-101 surfactant | 0.1 |
| Copper stearate (10% dispersion in ERL 4221) | 1.0 |

Using the above base resin, a formulation 6-1 with particulate silver was prepared containing the following components:

| | |
|---|---|
| Base resin | 19 |
| Silflake 95–235 | 40.5 |
| Silflake 95–131 | 40.5 |

The above formulation had a viscosity of 18000 centipoise at 25° C. After curing for 1 hour at 140° C. the $T_g$ of the polymer so obtained was 130° C.

EXAMPLE 7

DIE-ATTACH ADHESIVE

| BASE FORMULATIONS | Parts by Weight | | |
|---|---|---|---|
| ERL 4221E | 50 | | |
| Siloxy Monomer | 35 | | |
| Siloxy: CTBN adduct (50:50) | 15 | | |
| Irganox 1035 | 0.3 | | |
| FINAL FORMULATIONS | A | B | C |
| Base | 21 | 21 | 11 |
| Wetting Agent (Pluronic L-101) | 0.2 | 0.2 | 0.2 |
| Silane A-187 | 0.6 | 0.6 | 0.3 |
| Silverflake AAR-0595 | 50 | 20 | 56 |
| Silflake 450 | 28 | 58 | 32 |
| Iod. Catalyst (50% in 4221 E) | 0.55 | 0.55 | 0.4 |
| Copper Naphthenate (8% Cu) | 0.02 | 0.02 | 0.014 |
| Viscosity @ 25° C., cps | 8000 | 12000 | 25500 |
| Gel Time @ 120° C. | 2 mins | | |
| Shelf Life @ 25° C. | >7 days | | |
| @ −40° C. | >6 months | | |
| Cure Cycle | 1 hour @ 150° C. or 1 min @ 170° C. | | |
| Cure Volatiles @ 150° C. | <0.2% | <0.2% | <0.1% |
| Volume Resistivity, ohm-cm | 3.4 × 10$^{-4}$ | 4.8 × 10$^{-4}$ | 2.2 × 10$^{-4}$ |
| Thermal Conductivity, w/m °C. | >2 | >2 | >4 |

EXAMPLE 8

ELECTRICALLY NON-CONDUCTIVE DIE ATTACH ADHESIVE

In a similar manner to that of Example 2, a base resin was prepared consisting of the following components:

| Component | Parts by Weight |
|---|---|
| ERL 4221E (EECH) | 49 |
| Siloxy monomer I | 33 |
| Siloxy monomer/carboxyl terminated polybutadiene adduct (50:50) | 15 |
| Irganox 1035 | 0.3 |
| 4(2-hydroxy-1-tetradecyloxyphenyl) phenyl-iodonium hexafluoroantimonate (50% in 4221E) | 2.0 |
| A187 glycidyloxypropyltrimethoxysilane | 0.7 |
| Copper stearate (10% dispersion in ERL 4221 | 1.1 |

Using the above base resin, three formulations with various particulate fillers were prepared containing the following components:

Formulation 8-1

| | |
|---|---|
| Base resin | 25 |
| Silica | 75 |
| Pluronic L-101 | 0.2 |

Formulation 8-2

| | |
|---|---|
| Base resin | 25 |
| Silica-coated aluminum nitride (DOW) | 75 |
| Pluronic L-101 | 0.2 |

Formulation 8-3

| | |
|---|---|
| Base resin | 25 |
| Calcined alumina | 75 |
| Pluronic L-101 | 0.2 |

Formulation 8-1 was further tested and the following properties were obtained:

| | |
|---|---|
| Viscosity @ 25° C. (cp-52, 5 rpm) | 20,000 cps |
| Specific gravity | 1.7 |
| Gel time @ 140° C. | 1–2 mins. |
| Pot life @ 25° C. | >14 days |
| Cure volatiles at 50° C. | <0.05% |
| Glass transition temp. (Tg) | >150° C. |
| Coefficient of thermal expansion (CTE) | 16–19 ppm |
| Hardness, Shore D | 90–95 |
| Storage Modulus @ 25° C. | 10GPA |
| @ 125° C. | 1 GPA |
| Wt. loss @ 300° C. | <0.1% |
| Moisture absorption (7 days @ 25° C.) | <0.15% |
| Die-Shear, Kg (1.25 mm × 1.25 mm, bare Copper) cure - 1 min @ 170° C. | >3.5 |
| Ionic content (Na, K, Cl) | <10 ppm |
| Shelf life @ 25° C. | >14 days |
| @ −20° C. | >3 months |
| @ −40° C. | >6 months |

EXAMPLE 9

UNDERFILL

| | Parts by Weight | | |
|---|---|---|---|
| BASE FORMULATIONS | A | B | C |
| ERL 4221E | 50 | 50 | 47 |
| Siloxy Monomer | 37 | 37 | 35 |
| Epoxidized PolyBD (Poly BD565) | 10 | x | x |
| Siloxy: CTB adduct (50:50) | x | 10 | 15 |

-continued

| BASE FORMULATIONS | Parts by Weight A | B | C |
|---|---|---|---|
| Irganox 1035 (Antioxidant) | 0.4 | 0.4 | 0.4 |
| Silane A-187 (Adhesion promoter) | 1.5 | 1.5 | 1.5 |
| Copper Stearate (10% dispersiom in Epon 828) | 1.1 | 1.1 | 1.1 |
| FINAL FORMULATIONS | A | B | C |
| Base | 25.5 | 25.5 | 25.5 |
| Wetting Agent (Pluronic L-101) | 0.2 | 0.2 | 0.2 |
| Silane Treated Silica | 74.0 | 74.0 | 74.0 |
| Iod. Catalyst: 4(2-hydroxy-1-tetradecyloxphenyl)phenyl-iodonium hexafluoroantimonate (50% in 4221E) | 0.5 | 0.5 | 0.5 |
| Viscosity @ 25° C., cps | 6,400 | 6,000 | 8,400 |
| @ 80° C., cps | 425 | 380 | 510 |
| Flow @ 80° C., (0.05–0.075 mm gap between glass plates) | | | |
| 5 minutes | <3.2 mm | <3.2 mm | <1.6 mm |
| 10 minutes | <6.4 mm | <6.4 mm | <1.6 mm |
| Gel Time @ 80° C. | >20 mins | >20 mins | >20 mins |
| @ 120° C. | 2 mins | 2 mins | 2 mins |
| CTE (0–100° C.) | 25 ppm | 23 ppm | 19 ppm |
| Tg | >140° C. | >140° C. | >140° C. |

EXAMPLE 10
UNDERFILL

| BASE FORMULATIONS | Parts by Weight A | B |
|---|---|---|
| ERL 4221E | 50 | 51 |
| Siloxy Monomer | 38 | 39 |
| Siloxy: CTB adduct (50:50) | 10 | 8 |
| Irganox 1035 (Antioxidant) | 0.4 | 0.4 |
| Silane A-187 (Adhesion promoter) | t.6 | 1.6 |
| FINAL FORMULATIONS | A | B |
| Base | 27.5 | 30.5 |
| Triton X-100 | x | 0.7 |
| Silane Treated Silica | 72 | 68 |
| Phthalo Blue (2% dispersion in 4221E) | 0.4 | 0.4 |
| Iod. Catalyst: (50% in 4221E) | 0.55 | 0.61 |
| Viscosity @ 25° C., cps | 5,500 | 3,600 |
| @ 80° C., cps | 300 | 225 |
| Flow @ 80° C., (0.05–0.075 mm gap between glass plates) | | |
| 5 minutes | <3.2 mm | <9.5 mm |
| 10 minutes | <6.4 mm | <12.7 mm |
| Gel Time @ 80° C. | >4 hours | >4 hours |
| @ 120° C. | 5–7 mins | 5–7 mins |
| Shelf Life @ 25° C. | >3 months | >3 months |
| @ -20° C. | >6 months | >6 months |
| @ -40° C. | >12 months | >12 months |
| CTE (0–100° C.) | 25 ppm | 29 ppm |
| Tg | >140° C. | >140° C. |
| Storage Modulus, GPA | 8 ± 1 | 6 ± 1 |

EXAMPLE 11
UNDERFILL

| BASE FORMULATIONS | Parts by Weight A | B | C |
|---|---|---|---|
| ERL 4221E | 51 | 51 | 60 |
| Siloxy Monomer | 41 | 41 | 20 |
| EPLO (Vikoflex 7190) | x | x | 20 |
| Siloxy: CTB adduct (50:50) | 8 | x | x |
| Epoxidized PolyBD (Poly BD605) | x | 8 | x |
| Irganox 1035 (Antioxidant) | 0.4 | 0.4 | 0.4 |
| FINAL FORMULATIONS | A | B | C |
| Base | 29.5 | 29.5 | 30 |
| Wetting Agent (Pluronic L-101) | 1 | 1 | x |
| Silane A-187 (Adhesion promoter) | 1 | 1 | 1.4 |
| Phthalo Blue dispersion | 0.4 | 0.4 | 0.4 |
| Silica (treated) PLV-6S | 15 | 15 | 15 |
| Silica, 4910-20 | 53 | 53 | 53 |
| Iod. Catalyst (50% in 4221E) | 0.7 | 0.7 | 0.7 |
| Copper Naphthenate (8% Cu) | 0.021 | 0.021 | 0.021 |
| Mercaptopropyltriethoxysilane (A-1891) | 1 | 1 | 1 |
| Viscosity @ 25° C., cps | 7,100 | 6,600 | 9,100 |
| @ 80° C., cps | 270 | 250 | 320 |
| Flow @ 80° C., (0.05–0.075 mm gap between glass plates) | | | |
| 5 minutes | <6.4 mm | <12.7 mm | <12.7 mm |
| 10 minutes | <12.7 min | <19.1 mm | <19.1 mm |
| Gel Time @ 80° C. | >20 mins | >20 mins | >20 mins |
| @ 120° C. | 2 mins | 2 mins | 2 mins |
| Shelf Life @ 25° C. | >7 days | >7 days | >7 days |
| @ -20° C. | >3 months | >3 months | >3 months |
| @ -40° C. | >6 months | >6 months | >6 months |
| Cure Cycle | 1–1 ½ hour @ 140° C. | | |
| CTE (0–100° C.) | 27 ppm | 30 ppm | 33 ppm |
| Tg | >140° C. | >140° C. | >130° C. |
| Storage Modulus, GPA | 7 | 7 | 7 |

EXAMPLE 12

UNDERFILL

| BASE FORMULATIONS | Parts by Weight A | B | C |
|---|---|---|---|
| ERL 4221E | 50 | 42 | 32 |
| Siloxy Monomer | 42 | 50 | 60 |
| Epoxidized Poly-BD (Poly BD605) | x | 4 | x |
| EPLO/DCPDO Add. | 8 | 4 | 8 |
| Irganox 1035 | 0.4 | 0.4 | 0.4 |
| FINAL FORMULATIONS | A | B | C |
| Base | 30 | 30 | 31 |
| Wetting Agent Pluronic (L-101) | 1 | 1 | 1 |
| Silane A-187 (Adhesion promoter) | 0.5 | 0.5 | 0.5 |
| Silane A-137 | 0.5 | 0.5 | 0.5 |
| Phthalo Blue Dispersion (2%) | 0.4 | 0.4 | 0.4 |
| Silica (treated) PLV-6S | 15 | 15 | 14 |
| Silica, 4910–20 | 52 | 52 | 52 |
| Iod. Catalyst (50% in 4221E) | 0.7 | 0.7 | 0.7 |
| Copper Naphthenate (8% Cu) | 0.02 | 0.02 | 0.02 |
| Viscosity @ 25° C., cps | 2,900 | 3,000 | 1,200 |
| @ 80° C., cps | 200 | 175 | 95 |
| Flow @ 80° C., (0.05–0.075 mm gap between glass plates) | | | |
| 5 minutes | 25.4 mm | 31.8 mm | 38.1 mm |
| 10 minutes | 38.1 mm | 44.5 mm | 50.8 mm |
| Gel Time @ 80° C. | >20 mins | >20 mins | >20 mins |
| @ 120° C. | 2 mins | 2 mins | 2 mins |
| Shelf Life @ 25° C. | >7 days | >7 days | >7 days |
| @ -20 C. | >6 months | >6 months | >6 months |
| @ -40° C. | >12 months | >12 months | >12 months |
| Cure Cycle | 1-1 ½ hour @ 140° C. | | |
| CTE (0–100° C.) | 45 ppm | 30 ppm | 35 ppm |
| Tg | >140° C. | >140° C. | >130° C. |
| Storage Modulus, GPA | 6 | 6 | 6 |
| Moisture Absorption (%) 14 days @ 85° C., 85% Relative Humidity | 0.17 | 0.16 | 0.17 |

EXAMPLE 13

UNDERFILL

| BASE FORMULATIONS | Parts by Weight | |
|---|---|---|
| | A | B |
| ERL 4221E | 30 | 20 |
| Siloxy Monomer | 60 | 66 |
| Siloxy: CTBN adduct (50:50) | 10 | 14 |
| Irganox 1035 | 0.3 | 0.3 |
| FINAL FORMULATIONS | A | B |
| Base | 31 | 33 |
| Wetting Agent (Pluronic L-101) | 1 | 1 |
| Silane A-187 | 0.5 | 0.5 |
| Silane A-137 | 0.5 | 0.5 |
| Silane A-1891 | 1 | 1 |
| Phthalo Blue Dispersion (2%) | 0.4 | 0.4 |
| Silica PLV-65 (w/137) | 14 | 13 |
| Silica 4910–20 | 51 | 50 |
| Iod. Cat. (50% in 4221E) | 0.8 | 1.0 |
| Copper Naphthenate (8% Cu) | 0.022 | 0.022 |
| Viscosity @ 25° C., cps | 3,600 | 2,500 |
| Flow @ 80° C., (0.05–0.075 mm gap between glass plates) | | |
| 2 minutes | 19.0 mm | 12.7 mm |
| Gel Time @ 120° C. | 3–5 mins | |
| Shelf Life @ 25° C. | >3 days | |
| @ –40° C. | >6 months | |
| Cure Cycle | 1 hour @ 150° C. | |

EXAMPLE 14

GLOB-TOP (HIGH PROFILE)

| BASE FORMULATIONS | Parts by Weight | | |
|---|---|---|---|
| | A | B | C |
| ERL 4221E | 50 | 57 | 50 |
| Siloxy Monomer | 35 | 26 | 35 |
| 4221E: CTB adduct (50:50) | 15 | x | 15 |
| Siloxy: CTB adduct (50:50) | x | 15 | x |
| Irganox 1035 | 0.4 | 0.4 | 0.4 |
| FINAL FORMULATIONS | A | B | C |
| Base | 21.5 | 20.0 | 24.5 |
| Wetting Agent (Pluronic L-101) | 0.3 | 0.3 | 0.3 |
| Silane A-187 (Adhesion promoter) | 0.7 | 0.7 | 0.7 |
| Carbon Black (Raven 450) | 0.1 | 0.1 | 0.1 |
| Treated Silica (FB74FCS) | 77.0 | 78.5 | 74.0 |
| Iod. Catalyst (50% in 4221E) | 0.5 | 0.5 | 0.6 |
| Copper Naphthenate (8% Cu) | 0.016 | 0.016 | 0.2 |
| Viscosity @ 25° C., cps | 60,000 | 67,000 | 25,000 |
| Gel Time @ 120° C. | 2–3 mins | | |
| Shelf Life @ 25° C. | >7 days | | |
| @ –20° C. | >6 months | | |
| @ –40° C. | >12 months | | |
| Cure Cycle | 1–1 ½ hour @ 140° C. | | |
| CTE (0–100° C.) | 12 ppm | 13 ppm | 18 ppm |
| Storage Modulus, @ 25° C., GPA | 15 | 15 | 10 |
| Wt. Loss @ 300 C | <0.1% | | |
| Moisture Absorption (14 days) @ 85° C./85% Relative Humidity | <0.15% | | |

EXAMPLE 15

GLOB-TOP (LOW PROFILE)

| BASE FORMULATIONS | Parts by Weight | |
|---|---|---|
| | A | B |
| ERL 4221E | 50 | 50 |
| Siloxy Monomer | 36 | 40 |
| 4221E: CTB adduct (50:50) | x | 10 |
| Siloxy: CTB adduct (50:50) | 14 | x |
| Irganox 1035 | 0.4 | 0.4 |
| FINAL FORMULATIONS | A | B |
| Base | 27.0 | 25.0 |
| Wetting Agent (Pluronic L-101) | 0.5 | 0.5 |
| Silane A-187 (Adhesion promoter) | 0.5 | 0.5 |
| Phthalo Blue Disp. | 0.2 | 0.4 |
| Orasol Black CN | 0.1 | x |
| Treated Silica (FB74FCS) | 32 | 33 |
| Silica GP-3I | 40 | 40 |
| Iod. Catalyst (50% in 4221E) | 0.6 | 0.6 |
| Copper Naphthenate (8% Cu) | 0.02 | 0.02 |
| Viscosity @ 25° C., cps | 30,000 | 20,000 |
| Gel Time @ 120° C. | 2–3 mins | |
| Shelf Life @ 25° C. | >7 days | |
| @ –20° C. | >6 months | |
| @ –40° C. | >12 months | |
| Cure Cycle | 1–1 ½ hour @ 140° C. | |
| CTE (0–100° C.) | 19 ppm | 20 ppm |
| Storage Modulus, @ 25°C., GPA | 9 | 8 |
| Wt. Loss @ 300 C | <0.1% | |
| Moisture Absorption (14 days) @ 85° C./85% Relative Humidity | <0.15% | |

EXAMPLE 16

GLOB-TOP & DIE ATTACH ADHESIVES
(Thermally Conductive)

| BASE FORMULATIONS | Parts by Weight | |
|---|---|---|
| ERL 4221E | 50 | |
| Siloxy Monomer | 35 | |
| Siloxy: CTB adduct (50:50) | 15 | |
| Irganox 1035 | 0.4 | |
| FINAL FORMULATIONS | A | B |
| Base | 27.0 | 21.5 |
| Wetting Agent (Pluronic L-101) | 0.3 | 0.3 |
| Silane A-187 | 0.7 | 0.7 |
| Carbon Black (Raven 450) | 0.1 | 0.1 |
| Silica Coated Aluminum Nitride (DOW) | 72 | 77 |
| Iod. Catalyst (50% in 4221E) | 0.6 | 0.5 |
| Copper Naphthenate (8% Cu) | 0.02 | 0.016 |
| Mercaptopropyltriethoxysilane (A-1891) | 1.0 | 1.0 |
| Viscosity @ 25° C., cps | 35,000 | 60,000 |
| Gel Time @ 120° C. | 2 mins | |
| Shelf Life @ 25° C. | >7 days | |
| @ –20° C. | >6 months | |
| @ –40° C. | >12 months | |
| Cure Cycle | 1 hour @ 140° C. | |
| CTE (0–100° C.) | 22 ppm | 15 ppm |
| Storage Modulus, @ 25° C., GPA | 9 | 14 |
| Wt. Loss @ 300 C | <0.1% | |
| Moisture Absorption (14 days) @ 85° C./85% Relative Humidity | <0.15% | |
| Thermal Conductivity, W/Mk | >2.0 | >2.5 |

EXAMPLE 17
GLOB-TOP & DIE-ATTACH ADHESIVES
(Thermally Conductive)

| BASE FORMULATIONS | Parts by Weight | | |
|---|---|---|---|
| ERL 4221E | 50 | | |
| Siloxy Monomer | 35 | | |
| Siloxy: CTBN adduct (50:50) | 15 | | |
| Irganox 1035 | 0.4 | | |
| FINAL FORMULATIONS | A | B | C |
| Base | 21 | 25 | 21 |
| Wetting Agent (Pluronic L-101) | 0.5 | 0.5 | 0.5 |
| Silane A-187 | 0.7 | 0.7 | 0.7 |
| Silica Coated AlN | 78 | 74 | 76 |
| Iod. Cat. (50% in 4221 E) | 0.6 | 0.7 | 0.7 |
| Copper Naphthenate (8% Cu) | 0.02 | 0.02 | 0.02 |
| Paraloid 2691* | — | — | 3 |
| Viscosity @ 25° C., cps | 80,000 | 20,000 | 90,000 |
| Gel Time @ 120° C. | 2–4 mins | | |
| Shelf Life @ 25° C. | 1–2 days | | |
| @ −40° C. | >6 months | | |
| Cure Cycle | 1 hour @ 150° C. | | |

*Particulate elastomeric modifier from Rohm and Haas

EXAMPLE 18
GLOB-TOP & DIE-ATTACH ADHESIVES
(Non Conductive)

| BASE FORMULATIONS | Parts by Weight | | |
|---|---|---|---|
| ERL 4221E | 50 | | |
| Siloxy Monomer | 35 | | |
| Siloxy: CTBN adduct (50:50) | 15 | | |
| Irganox 1035 | 0.4 | | |
| FINAL FORMULATIONS | A | B | C |
| Base | 26.5 | 21 | 24 |
| Wetting Agent (Pluronic L-101) | 0.5 | 0.3 | 0.3 |
| Silane A-187 | 0.5 | 0.7 | 0.7 |
| Orasol Black CN | 0.1 | 0.1 | 0.1 |
| Silica FB-74FCS | 32 | 77 | 72 |
| Silica GP-3I | 40 | — | — |
| Iod. Catalyst (50% in 4221 E) | 0.7 | 0.6 | 0.6 |
| Copper Naphthenate (8% Cu) | 0.02 | 0.02 | 0.02 |
| Mercaptopropyltriethoxysilane (A-181) | 1.0 | 1.0 | — |
| D.C. 4-7051* | — | — | 2 |
| Viscosity @ 25° C., cps | 45,000 | 65,000 | 38,000 |
| Gel Time @ 120° C. | 3–5 mins | | |
| Shelf Life @ 25° C. | 14 days | | |
| @ −40° C. | >6 months | | |
| Cure Cycle | 1 hour @ 150° C. | | |

*Particulate elastomeric modifier from Dow-Corning

EXAMPLE 19
POLYMER-BUMP & SOLDER BALL REPLACEMENTS

| BASE FORMULATIONS | Parts by Weight | | |
|---|---|---|---|
| ERL 4221E | 50 | | |
| Siloxy Monomer | 35 | | |
| Siloxy: CTBN adduct (50:50) | 15 | | |
| Irganox 1035 | 0.3 | | |
| FINAL FORMULATIONS | A | B | C |
| Base | 11 | 6 | 6 |
| Wetting Agent (Pluronic L-101) | 0.2 | 0.1 | 0.1 |
| Silane A-187 | 0.3 | 0.2 | 0.2 |
| Silverflake AAR-0595 | 88.2 | — | — |
| Silflake 492 | — | 34 | 10 |
| Silpowder SI-500* | — | 60 | 84 |
| Iod. Catalyst (50% in 4221E) | 0.4 | 0.2 | 0.2 |
| Copper Naphthenate (8% Cu) | 0.01 | 0.01 | 0.01 |
| Viscosity @ 25° C., cps | 54000 | 170000 | 44000 |
| Gel Time @ 120° C. | 2 mins | | |
| Shelf Life @ 25° C. | >3 days | | |
| @ −40° C. | >6 months | | |
| Cure Cycle | 1 hour @ 150° C. or 1 hour @ 170° C. | | |
| Cure Volatiles @ 150° C. | <0.1% | <0.05% | <0.05% |
| Volume Resistivity ohm-cm | $6.4 \times 10^{-5}$ | $6.5 \times 10^{-5}$ | $3.2 \times 10^{-5}$ |

*25–35 micron spherical silver powder

EXAMPLE 20
LOW STRESS ENCAPSULATIONS

| BASE FORMULATIONS | Parts by Weight | |
|---|---|---|
| | A | B |
| ERL 4221E | 40 | 20 |
| Siloxy Monomer | 40 | 40 |
| Epiclon EXA-850 CPR* | — | 20 |
| Siloxy: CTBN adduct (50:50) | 20 | 20 |
| Irganox 1035 | 0.4 | 0.4 |
| FINAL FORMULATIONS | A | B |
| Base | 35 | 44 |
| Wetting Agent (Pluronic L-101) | 1 | 1 |
| Silane A-187 | 0.5 | 0.5 |
| Silane A-137 | 0.5 | 0.5 |
| Mercaptopropyltriethoxysilane (A-1891) | 1 | 0.5 |
| Phthalo Blue Dispersion (2%) | 0.5 | 0.5 |
| PLV-65 (w/137) | 60.2 | 51.6 |
| Iod. Catalyst (50% in 4221E) | 1.4 | 1.4 |
| Copper Naphthenate (8% Cu) | 0.03 | 0.035 |
| Viscosity @ 25° C., cps | 3,600 | 2,900 |
| Gel Time @ 120° C. | 6–8 mins | |
| Shelf Life @ 25° C. | >7 days | |
| @ −40° C. | >6 months | |
| Cure Cycle | 1 hour @ 150° C. | |

*Low viscosity, ultra clean, low chlorine BPA epoxy resin

The foregoing results from testing compositions of the invention illustrate several major advantages over known die-attach, polymer bump, and encapsulant compositions. Attention is drawn to five significant parameters: (1) moisture absorption; (2) cure speed; (3) shelf life at room temperature (25° C.); (4) weight loss during cure; and (5) thermal stability at higher temperatures (evidenced by low weight loss and no, or minimum loss of, adhesion at higher temperature). These parameters are of particular importance for die-attach, polymer bump, and encapsulant formulations because of the failures that commonly arise when devices incorporating known compositions are processed at elevated temperatures or are subsequently exposed to moisture.

The relationship of CTE to temperature is both important and subtle. When the CTE of the cured die-attach or encapsulant is significantly different from the CTE of the substrate and die, separation readily occurs on heating. A problem arises because the CTE of polymer-based die-attach adhesives and encapsulants undergoes a marked change at the $T_g$ of the polymer. Thus, common polymers that might be otherwise useful, exhibit a CTE of 25–30 ppm below their $T_g$ and 80–90 ppm above their $T_g$. Since their $T_g$'s are commonly below 150° C., and the CTE of the substrate is about 15 ppm, severe constraints are presented on heating. The compositions of the invention, on the other hand, exhibit lower CTE's (20–25 ppm) that change very little below 200° C. (40–50 ppm). This appears to be in part a result of the very high cross-linking of the polymers of the invention.

Also noteworthy is the very low moisture absorption (0.05–0.2%) of the inventive polymeric die-attach adhesives, polymer bumps, and encapsulants compared to the moisture absorption accepted as the industry standard (0.4–0.8%).

Finally, the lessened weight loss on curing (commonly 0.04% for the inventive compositions vs. a norm of 0.4–0.8%) and the minuscule weight loss of cured material on heating at 300° C. (<0.1% for the inventive compositions vs. a norm of 0.4–0.6%) represent a remarkable improvement over compositions of the art.

These advantages in the cured polymer are complemented by the unexpectedly superior shelf life of the uncured monomer formulation. The composition described in Example 8-1 has been found to exhibit less than 1000 cps change in viscosity on storage at room temperature for two weeks; indeed, such change as was observed was a decrease in viscosity. This is in marked contrast to one-component monomer formulations of the art, which increase in viscosity by several thousand cps over a few hours.

We claim:

1. A resin composition comprising from about 5 to 40% by weight of a base resin and from about 60 to 95% by weight of a particulate filler selected from the group consisting of silver, gold, silica, alumina, quartz, aluminum nitride, aluminum nitride coated with silica, barium sulfate, alumina trihydrate, and boron nitride, wherein said base resin comprises:
   (a) from about 20 to 50 parts by weight of 1,1,3,3-tetramethyl-1,3-bis[2-(7-oxabicyclo[4.1.0]hept-3-yl) ethyl]disiloxane;
   (b) from about 30 to 60 parts by weight of 3,4-epoxycyclohexylmethyl-3',4'-epoxycyclohexane carboxylate, dicyclopentadiene dioxide, or bis(3,4-epoxycyclohexyl) adipate;
   (c) from about 0.5 to 3 parts by weight of an iodonium salt of formula

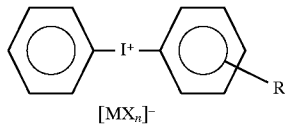

wherein M is selected from the group consisting of boron, phosphorus, and antimony; X is halogen or $C_6F_5$ when M is boron and n is 4; n is 4 or 6; and R is selected from the group consisting of hydrogen, $C_1$ to $C_{20}$ alkyl, $C_1$ to $C_{20}$ alkoxyl, $C_1$ to $C_{20}$ hydroxyalkoxyl, halogen, and nitro;
   (d) from zero to about 2 parts by weight of copper stearate, copper naphthenate, copper acetate, copper acetylacetonate, or copper 1,3-pentadienoate;
   (e) from about 0.4 to 5 parts by weight of glycidoxypropyltrimethoxysilane, octyltriethoxysilane, mercaptopropyltriethoxysilane, or mixtures thereof; and
   (f) from about 5 to 20 parts by weight of epoxidized polybutadiene, carboxyl-terminated polybutadiene, or carboxyl-terminated polybutadiene acrylonitrile.

2. The resin composition according to claim 1, wherein said iodonium salt is [4-(2-hydroxy-1-tetradecyloxy)-phenyl]phenyliodonium hexafluoroantimonate.

3. The resin composition according to claim 1, wherein said base resin comprises from about 30 to 60 parts by weight of 3,4-epoxycyclohexylmethyl-3',4'-epoxycyclohexane carboxylate.

4. A resin composition comprising from about 30 to 50% by weight of a base resin and from about 50 to 80% by weight of a particulate filler selected from the group consisting of silica, quartz, alumina, aluminum nitride, aluminum nitride coated with silica, barium sulfate, alumina trihydrate, and boron nitride, wherein said base resin comprises:
   (a) from about 30 to 70 parts by weight of 1,1,3,3-tetramethyl-1,3-bis[2-(7-oxabicyclo[4.1.0]hept-3- yl) ethyl]disiloxane;
   (b) from about 20 to 65 parts by weight of 3,4-epoxycyclohexylmethyl-3',4'-epoxycyclohexane carboxylate, dicyclopentadiene dioxide, or bis(3,4-epoxycyclohexyl) adipate;
   (c) from about 0.5 to 3 parts by weight of an iodonium salt of formula

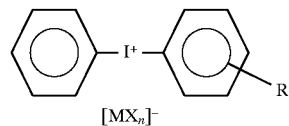

wherein M is selected from the group consisting of boron, phosphorus, and antimony; X is halogen or $C_6F_5$ when M is boron and n is 4; n is 4 or 6; and R is selected from the group consisting of hydrogen, $C_1$ to $C_{20}$ alkyl, $C_1$ to $C_{20}$ alkoxyl, $C_1$ to $C_{20}$ hydroxyalkoxyl, halogen, and nitro;
   (d) from zero to about 1.5 parts by weight of copper stearate, copper naphthenate, copper acetate, copper acetylacetonate, or copper 1,3-pentadienoate;
   (e) from about 1 to 8 parts by weight of glycidoxypropyltrimethoxysilane, octyltriethoxysilane, mercaptopropyltriethoxysilane, or mixtures thereof; and
   (f) from about 3 to 10 parts by weight of epoxidized polybutadiene, carboxyl-terminated polybutadiene, or carboxyl-terminated polybutadiene acrylonitrile.

5. The resin composition according to claim 4, wherein said iodonium salt is [4-(2-hydroxy-1-tetradecyloxy)-phenyl]phenyliodonium hexafluoroantimonate.

6. The resin composition according to claim 4, wherein said base resin comprises from about 20 to 65 parts by weight of 3,4-epoxycyclohexylmethyl-3',4'-epoxycyclohexane carboxylate.

7. A resin composition comprising from about 15 to 40% by weight of a base resin and from about 60 to 85% by weight of a particulate filler selected from the group consisting of silica, quartz, alumina, aluminum nitride, aluminum nitride coated with silica, barium sulfate, alumina trihydrate, and boron nitride, wherein said base resin comprises:
   (a) from about 20 to 50 parts by weight of 1,1,3,3-tetramethyl-1,3-bis[2-(7-oxabicyclo[4.1.0]hept-3-yl) ethyl]disiloxane;
   (b) from about 30 to 70 parts by weight of 3,4-epoxycyclohexylmethyl-3',4'-epoxycyclohexane carboxylate, dicyclopentadiene dioxide, or bis(3,4-epoxycyclohexyl) adipate, and from zero to about 30 parts by weight of a diglycidyl ether of bisphenol A, a diglycidyl ether of bisphenol F, a diglycidyl ether of tetrabromo-bisphenol A, an epoxy cresol novolac, or an epoxy phenol novolac;

(c) from about 0.5 to 3 parts by weight of an iodonium salt of formula

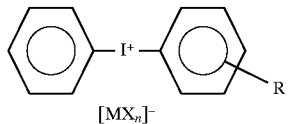

wherein M is selected from the group consisting of boron, phosphorus, and antimony; X is halogen or $C_6F_5$ when M is boron and n is 4; n is 4 or 6; and R is selected from the group consisting of hydrogen, $C_1$ to $C_{20}$ alkyl, $C_1$ to $C_{20}$ alkoxyl, $C_1$ to $C_{20}$ hydroxyalkoxyl, halogen, and nitro;

(d) from zero to about 1 part of copper stearate, copper naphthenate, copper acetate, copper acetylacetonate, or copper 1,3-pentadienoate;

(e) from about 1 to 5 parts by weight of glycidoxypropyltrimethoxysilane, octyltriethoxysilane, mercaptopropyltriethoxysilane, or mixtures thereof; and (f) from about 4 to 10 parts by weight of epoxidized polybutadiene, carboxyl-terminated polybutadiene, or carboxyl-terminated polybutadiene acrylonitrile.

8. The resin composition according to claim 7, wherein said iodonium salt is [4-(2-hydroxy-1-tetradecyloxy)-phenyl]phenyliodonium hexafluoroantimonate.

9. The resin composition according to claim 7, wherein said base resin comprises from about 30 to 70 parts by weight of 3,4-epoxycyclohexylmethyl-3',4'-epoxycyclohexane carboxylate.

* * * * *

UNITED STATES PATENT AND TRADEMARK OFFICE
CERTIFICATE OF CORRECTION

PATENT NO. 5,863,970

DATED      January 26, 1999

INVENTOR(S) Ghoshal et al.

It is certified that error appears in the above-identified patent and that said Letters Patent is hereby corrected as shown below:

Col. 12, line 25, please insert --methacrylate-butadiene-styrene copolymer modifier-- after "elastomeric".

Col. 23, line 24, please insert --(methacrylate-butadiene-styrene toughener)-- after "modifier."

Col. 23, line 51, please insert --(silicon elastomer coated with inorganic filler)-- after "modifier."

Signed and Sealed this

Twenty-sixth Day of October, 1999

Attest:

Q. TODD DICKINSON

*Attesting Officer*    Acting Commissioner of Patents and Trademarks